United States Patent [19]
Werner

[11] Patent Number: 5,914,520
[45] Date of Patent: *Jun. 22, 1999

[54] MICROMECHANICAL SENSOR DEVICE

[75] Inventor: Wolfgang Werner, Müchen, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/619,571

[22] PCT Filed: Sep. 22, 1994

[86] PCT No.: PCT/DE94/01103

§ 371 Date: Mar. 26, 1996

§ 102(e) Date: Mar. 26, 1996

[87] PCT Pub. No.: WO95/09366

PCT Pub. Date: Apr. 6, 1995

[30] Foreign Application Priority Data

Sep. 27, 1993 [DE] Germany .............................. 43 32 843

[51] Int. Cl.⁶ .............................. H01L 29/82; G01P 3/42; H01G 7/00
[52] U.S. Cl. .......................... 257/415; 257/417; 257/418; 257/419; 324/162; 324/658; 361/283.1; 361/283.3
[58] Field of Search .................................... 257/415, 417, 257/419, 420, 418; 324/162, 661, 658; 361/283.1, 283.3

[56] References Cited

U.S. PATENT DOCUMENTS

| 4,838,088 | 6/1989 | Murakami | 73/724 |
|---|---|---|---|
| 4,930,043 | 5/1990 | Wiegand | 73/514.18 |
| 4,999,735 | 3/1991 | Wilner | 361/283.3 |
| 5,006,487 | 4/1991 | Stokes | 437/228 |
| 5,008,774 | 4/1991 | Bullis et al. | 73/514.13 |
| 5,025,346 | 6/1991 | Tang et al. | 361/283.1 |
| 5,043,043 | 8/1991 | Howe et al. | 216/17 |
| 5,121,180 | 6/1992 | Beringhause et al. | 257/417 |
| 5,216,490 | 6/1993 | Greiff et al. | 73/514.35 |

FOREIGN PATENT DOCUMENTS

| 0 451 992 | 10/1991 | European Pat. Off. . |
|---|---|---|
| 0 456 029 | 11/1991 | European Pat. Off. . |
| 0 591 554 | 4/1994 | European Pat. Off. . |
| 37 23 561 | 1/1988 | Germany . |

OTHER PUBLICATIONS

Electronic Design, Aug. 8, 1991, Frank Goodenough, "Airbags Boom When IC Accelerometer Sees 50 G", pp. 45–56.

Semiconductor International, Industry News, Oct. 1991, Analog devices Combines Micromachining and BiCMOS, 1 sheet.

Technical Digest of the 7th Sensor Symposium, 1988, K. Ikeda et al, "Silicon Pressure Sensor With Resonant Strain Gages Built Into Diaphragm", pp. 55–58.

(List continued on next page.)

Primary Examiner—Mahshid Saadat
Assistant Examiner—Allan R. Wilson
Attorney, Agent, or Firm—Hill & Simpson

[57] ABSTRACT

A micromechanical device contains, on a carrier or substrate (1, 10), a micromechanical region which is covered on the chip by a planar covering (D) arranged on the carrier. A method for the production of a micromechanical device of this type provides that a body is formed in which a first insulating layer (2, 11) is arranged on a carrier (1, 10) and a silicon layer (3, 12) is arranged over the insulating layer. The silicon layer (3, 12) is structured, openings (L, LS) being formed down to the first insulating layers. An insulating layer region (IS, 13) and a planar further layer (P, 14) are applied. The further layer (P, 14) is structured, openings being formed down to the insulating layer region (IS, 13), the insulating layer region and the regions of the first insulating layer which are situated underneath it are selectively etched, and a covering layer is applied over the further layer as a planar covering (D). The device can be mounted in a plastic housing without a clean room atmosphere.

7 Claims, 4 Drawing Sheets

OTHER PUBLICATIONS

Sensors and Actuators, A21–A23 (1990), K. Ikeda et al, "Three-dimensional Micromachining of Silicon Pressure Sensor Integrating Resonant Strain Gauge on Diaphragm", pp. 1007–1010.

IEEE Robotics and Automation Society in cooperation with the ASME Dynamic Systems and Control Division, (1993), C.H. Mastrangelo et al, A Dry–Release Method Based on Polymer Columns For Microstructure Fabrication, pp. 77–81.

IEEE Circuits and Devices, Jul. 1993, M. Mehregany, "Microelectromechanical Systems", pp. 14–22.

Micromachining and Micropackaging of Transducers, edited by C.D. Fung et al, (Elsevier Science Publishers, 1985), H. Guckel, "Planar Processed, Integrated Displacement Sensors", pp. 199–203.

MICROMECHANICAL SENSOR DEVICE

BACKGROUND OF THE INVENTION

The invention relates to a micromechanical device and a method for its production.

Micromechanical devices such as sensors or actuators are increasingly finding their way into all areas of technology, for example into navigation systems and motor vehicles, particularly in connection with safety systems. Pressure and acceleration sensors form a large proportion of devices of this type. Sensors are required which are reliable, small, easy to produce and at the same time inexpensive and have a high measuring accuracy and good proportionality between the measured value and the output signal. The same is correspondingly true for actuators, so that, for the sake of simplicity, only sensors will be discussed below.

The majority of pressure or acceleration sensors used nowadays are produced by precision mechanics or by means of a KOH etching technique based on silicon (bulk micromachining). The sensor signal, generated to date mainly by means of the piezoelectric effect, is evaluated separately from the sensor. However, the trend is toward the intelligent sensor, in which the sensor and the circuit for evaluating the sensor signal and, if appropriate, a test circuit are integrated on a chip on the basis of silicon planar technology. The evaluation of the piezoresistive or capacitive sensor signal and the linearization and amplification take place using semiconductor circuits of known technologies. A sensor of this type is disclosed, for example, in the publication F. Goodenough: Airbags Boom When IC Accelerator Sees 50 G, Electronic Design, Aug. 8, 1991, pp. 45–56.

Whereas conventionally produced micromechanical sensors are relatively large, expensive and inaccurate, the above-mentioned publication describes an improved embodiment. This known, so-called surface-micromechanical sensor (surface micromachining) requires, as emerges, in particular, from the further publication relating to this: Analog Devices Combine Micromachining and BICMOS, Semiconductor International, Oct. 1991, 21 masks for its production, namely 6 masks for the sensor process and 15 masks for a 4 µm BICMOS process. The comb-shaped sensor element for forming the capacitive sensor comprises a polysilicon element 2 µm thick and is connected to the substrate surface by means of springs, which are likewise made of polysilicon.

A further capacitive structure is disclosed in U.S. Pat. No. 5,025,346.

The production method for the known sensors and actuators is extremely complicated and expensive. Furthermore, it is uncertain whether the polysilicon layers used for the mechanically moving parts of a sensor have adequate mechanical long-term stability. In addition to this possible degradation over time, the mechanical properties such as the modulus of elasticity or intrinsic stress of polysilicon are sensitively dependent on the respective process conditions during production. Thermal annealing of the intrinsic stress requires additional tempering steps in the production process, which has a disadvantageous effect on the electronic circuit which is simultaneously integrated in the sensor. Additional depositions of semiconductor layers are also necessary in the production process. In the case of a conceivable use of modern sub-µm BICMOS circuits for the evaluation circuit of the sensor, it is no longer possible to produce stress-free polysilicon layers on account of the low process temperatures used in this case.

One problem relates to the processing of micromechanical, if appropriate integrated micromechanical, devices which are produced on a semiconductor wafer. In order to separate the chips, the wafer is ground thin and the individual chips are subsequently sawn. In this case, the filigree structure of the micromechanical device must be covered with a film on the front side of said device. A clean room is required for processing in order that particles which might impair the usability of the micromechanical device or render it unusable cannot get into said micromechanical device. This processing procedure is expensive and not very practicable even with large batch quantities.

A micromechanical device which has been separated as a chip must be fitted into a housing for protection against external influences. A plastic housing is ruled out for known devices, since the mobility of the sensor is lost when the chip is sheathed in plastic. Molding pressures up to 80 bar can lead to the complete destruction of the micromechanical device. A micromechanical chip is therefore usually mounted in a cavity-type housing, which is, however, about 10 times more expensive than a plastic housing.

The publications K. Ikeda et al.: Silicon pressure sensor with resonant strain gauge built into diaphragm, Proc. of the 7th Sensor Symp., Tokyo, Japan, 1988, pp. 55–58 and K. Ikeda et al.: Three-dimensional micromachining of silicon pressure sensor integrating resonant strain gauge on diaphragm, Sensors and Actuators, A21–A23, 1990, pp. 1007–1010 disclose micromechanical pressure sensors having a polysilicon diaphragm on which a resonator which reacts to mechanical stresses is arranged. When the diaphragm bends, the resonant frequency of the resonator changes on account of the mechanical stresses. In order that the externally exerted pressure cannot act directly on the resonator and thereby lead to measurement signal corruption, the resonator on the diagram is covered with a cap. A sensor of this type must also be mounted in a cavity-type housing for protection against environmental influences.

European reference EP-A 0 451 992 describes a micromechanical device and a corresponding production method, which device has a movable element made of polysilicon and situated in a cavity. The cavity is closed by an oxide layer.

The invention has the object of specifying a micromechanical device which can be produced more simply and more cost-effectively, and a method for its production.

SUMMARY OF THE INVENTION

According to one aspect of the invention, the following steps are provided in a method for the production of a micromechanical device:

- a body is formed in which a first insulating layer is arranged on a carrier and a silicon layer is arranged over said insulating layer,
- the silicon layer is structured, openings being formed down to the first insulating layer,
- an insulating layer region and a planar further layer are applied,
- the further layer is structured, openings being formed down to the insulating layer region,
- the insulating layer region and the regions of the first insulating layer which are situated underneath it are selectively etched with the aid of the structured further layer as a mask, a covering layer is applied over the further layer as a planar covering, forming a closed cavity in the process.

According to a further aspect of the invention, a micromechanical device is provided which contains on a carrier a micromechanical region formed with the aid of a silicon layer, a planar covering of the micromechanical region being arranged on the carrier, forming a closed cavity in the process.

The invention has the advantage that the micromechanical device which is realized on a chip already has a covering on the chip, which covering is produced in the process line associated with the production of the micromechanical device. A clean room atmosphere is therefore no longer required during the processing of the wafer having the micromechanical devices, that is to say, inter alia, during the production of connections, during lapping and during separation of the chips. Furthermore, the chip no longer needs to be mounted in a cavity-type housing, rather it can be sheathed in an inexpensive plastic housing. The micromechanical device acquires substantially increased reliability, since the device is provided with a covering immediately after production while still on the wafer and is thus sufficiently protected for the following method steps. The mobility of the sensor is retained, because the covering forms a closed cavity in which the movable elements are arranged.

The invention has the further advantage that it is suitable both for known micromechanical devices which are realized using polycrystalline silicon and for devices in which the active region is realized in monocrystalline silicon. Monocrystalline silicon has accurately known mechanical properties which do not depend on the respective parameters of the production process. Moreover, the mechanical properties are not subject to any degradation over time, with the result that the long-term stability is very high.

The invention has the further advantage that it is fully VLSI-compatible using known and available trench etching and filling methods. Furthermore, the device according to the invention is mechanically robust, since the movable parts are situated in the silicon layer and not on the chip surface.

If electrodes of the sensor are perpendicular to the chip surface, a high specific capacity (component density) of the sensor is produced. At the same time, the sticking problem, that is to say adhesion of surfaces during or after a rinsing operation, is counteracted, since the rigidity of the sensor device perpendicular to the oscillation direction is very high.

Finally, the device according to the invention affords the considerable advantage in the event of integration of the evaluation circuit that, when using a bipolar or BICMOS process, the number of masks for producing the device is not increased or is increased only insignificantly in comparison with a standard process using these technologies.

In general terms the present invention is a method for producing a micromechanical device having a movable element. The method has the steps of:

forming a body having a carrier on which a first whole-area insulating layer is arranged and having a whole-area silicon layer arranged over the insulating layer;

structuring the silicon layer with openings formed down to the first insulating layer, which openings surround a movable element to be produced;

applying an insulating layer region, which extends over the openings and the movable element to be produced, and applying thereover a whole-area further layer;

structuring the further layer with windows down to the insulating layer region above the movable element to be produced;

selectively etching the insulating layer region and regions of the first insulating layer which are situated underneath the insulating layer region using the structured further layer as a mask, such that parts of the silicon layer are exposed and the movable element is completed; and applying a covering layer over the further layer as a planar covering, thereby forming a closed cavity.

Advantageous developments of the present invention are as follows.

A monocrystalline or polycrystalline layer is provided as the silicon layer.

The openings are filled with an insulating material following the structuring of the silicon layer, which insulating material is removed at least in subregions during the selective etching step.

The insulating layer region is formed at least in a region which is provided for movable elements of the device.

The insulating layer region is formed by local oxidation.

The further layer is formed as a passivation layer.

The further layer is formed as one of a nitride layer, silicon nitride layer, phosphorus glass layer, metal layer and an oxide layer.

One of an oxide layer, a nitride layer and a phosphorus glass layer is applied as the insulating layer region.

The method has the further step of forming supports for the covering in a movable part of the device, which supports are separated from a surrounding movable part.

In general terms the present invention is also a micromechanical device in a micromechanical region. The device has a carrier with a structured insulating layer arranged over the carrier. A silicon layer having a first subregion is arranged over the insulating layer and a second subregion, which has no insulating layer situated thereunder. A further layer is over the silicon layer, which, at least in the region of the second subregion, is not in contact with the silicon layer and which has windows in the region of the second subregion. A covering layer is a planar covering over the further layer, by which a closed cavity is produced.

An advantageous development of the present invention is that the region contains a micromechanical arrangement in a monocrystalline semiconductor layer.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
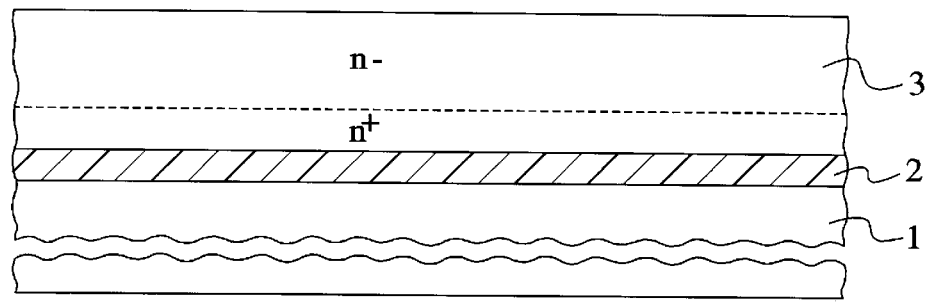
FIGS. 1 to 5 show cross sections through a first device according to the invention at different steps of the production method.

With reference to a first exemplary embodiment, FIG. 1 shows a base body which is formed during the production of the micromechanical device. A first insulating layer 2 is arranged on a carrier or substrate 1 and a monocrystalline silicon layer 3 is arranged on this insulating layer. The substrate may likewise consist of silicon. The thickness of the first insulating layer 2 is typically selected to be between 0.5 and 1 μm, while the thickness of the silicon layer 3 may be, for example, between 5 and 20 μm. The crystal orientation and doping of the substrate are as desired. The orientation and doping of the silicon layer 3 correspond to the basic technology used in the production of the micromechanical device and an integrated semiconductor circuit arrangement.

According to FIG. 1, that side of the silicon layer 3 which faces the insulating layer 2 or the lower boundary surface of the silicon layer is n+-doped, whereas that surface region of the silicon layer which is remote from the insulating layer 2 is n-doped. The doping of the silicon layer 3 is not necessary for the actual sensor element, but rather depends exclusively on the technology which is to be used for the circuit arrangement to be integrated.

The base body according to FIG. 1 may be, for example, a DWB wafer, where DWB stands for Direct Wafer Bonding. Wafers of this type are bonded together from two semiconductor wafers and are commercially available with a high quality and having the layer thicknesses and dopings shown in FIG. 1. A further possibility for producing the base body shown in FIG. 1 is the use of the so-called SIMOX method (I. Ruge, H. Mader: Halbleiter-Technologie [Semiconductor Technology], Springer-Verlag, 3rd Edition, 1991, page 237). An insulating layer made of silicon oxide is formed in this case by deep ion implantation of oxygen atoms into monocrystalline silicon. This may be followed by an epitaxy step. A third possibility for producing the base body according to FIG. 1 makes use of recrystallization, in which a silicon layer which is first deposited amorphously or in a polycrystalline form over a monocrystalline silicon layer and a silicon oxide layer arranged thereon is recrystallized by being melted with a laser beam.

Figure 2:
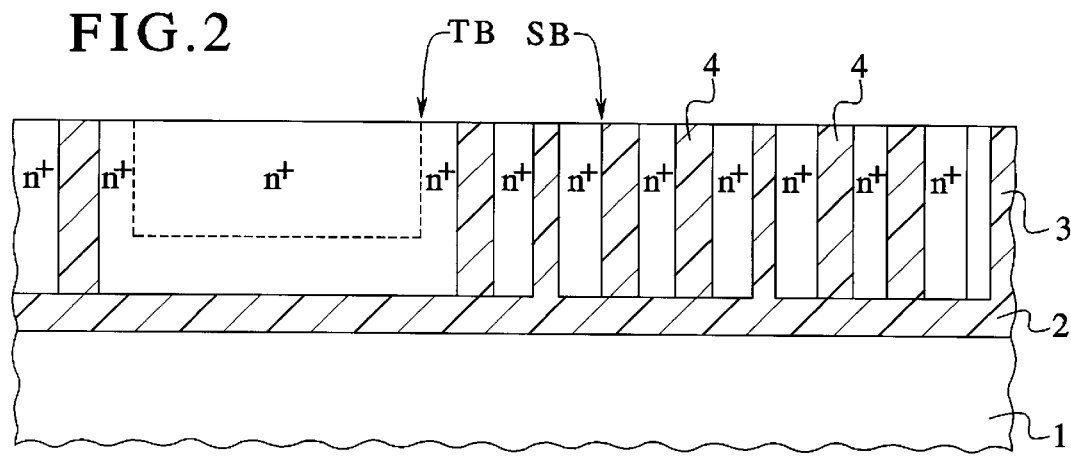

In a next step, trenches are etched into the monocrystalline silicon layer 3 down to the surface of the insulating layer 2, for example by means of anisotropic dry etching. The trenches are subsequently filled with a doping insulating material. Phosphorus glass (PSG) or boron phosphorus glass (BPSG) can be used in the exemplary embodiment according to FIG. 2. The production of glass layers of this type is disclosed, for example, in D. Widmann, H. Mader, H. Friedrich: Technologie hochintergrierter Schaltungen [Technology of large-scale integrated circuits], Springer-Verlag, 1988, page 80 ff. During a corresponding temperature treatment, phosphorus and, if appropriate, boron diffuse out of the phosphorus glass into the silicon of the trench walls of the silicon layer 3. This produces the structure which is shown in FIG. 2 and in which the insulating layer 2 and the doping insulating layer 4 abut against one another at the base of the previously etched trenches. The trench walls are doped in a manner corresponding to that region of the silicon layer 3 which adjoins the insulating layer 2, that is to say n+-doped in the exemplary embodiment.

By etching trenches in the silicon layer and doping the trench walls, both the region SB in which the actual sensor is provided and the region TB in which the electronic evaluation circuit, or at the very least a transistor arrangement for processing the sensor signal, is provided are structured and mutually insulated. The region TB contains one or more insulated troughs, in which CMOS, bipolar or other components are mounted, depending on the specification. If the transistor arrangement to be realized in the region TB is a bipolar transistor, for example, a buried collector region and a low-impedance collector connection in the form of the doped trench walls are already produced with the structure of the region TB shown in FIG. 2. By comparison with arrangements in the prior art, the production of the structure shown in FIG. 2 does not necessitate any separate masking and doping processes for the buried region, for a channel stopper and for a collector. An epitaxy process can likewise be dispensed with.

Subsequently, taking the structure of FIG. 2 as a starting point, insulation regions are produced in the regions TB and SB, said insulation regions being, in particular, field oxide regions produced by local oxidation, and a transistor arrangement is produced in the region TB. This transistor arrangement can be produced using a standard bipolar or BICMOS process. Examples of such processes are disclosed, for example, in the above-mentioned publication Widmann/Mader/Friedrich: Technologie hochintergrierter Schaltungen [Technology of large-scale integrated circuits]. Taking FIG. 2 as a starting point, the base region can be produced first, for example, in the case of a bipolar transistor structure and the p-type or n-type trough can be produced first in the case of a BICMOS process.

Of course, taking the structure of FIG. 2 as a starting point, it is also possible to realize an MOS transistor arrangement in the base body. In this case, too, the standard process begins with the production of a p-type or n-type trough in the region TB provided for the transistor structures.

Figure 3:
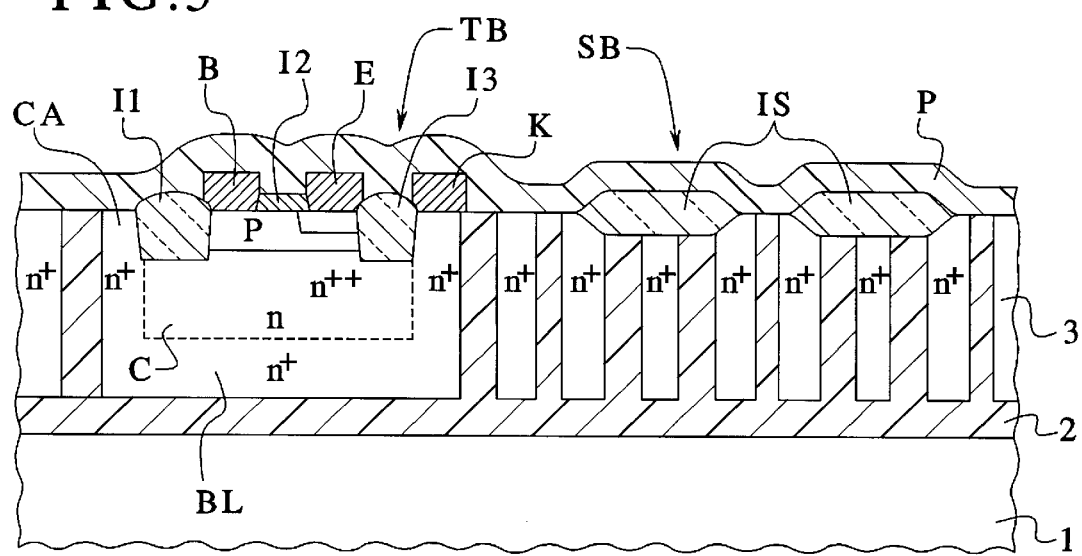

The production of field oxide regions by local oxidation also takes place in the sensor region SB at the same time as the process steps provided for the transistor process. Those regions of the sensor in which the movable elements or electrodes of the device are provided receive a field oxide IS, whereas the regions arranged in between are excluded from the local oxidation (LOCOS). If appropriate, the trench fillings are partly removed again prior to the LOCOS process, with the result that, after the oxidation process, the surface region which is situated between two field oxide regions and in which no movable elements of the device are provided is lower than the surface of the field oxide over the movable element, but higher than the lower boundary surface, arranged on this element, of the field oxide, FIG. 3, region SB.

During the production of the transistor arrangement, the region SB which is provided for the sensor element is covered, to the extent required, by an appropriate mask. According to FIG. 3, the result is, for example, a bipolar transistor whose collector C is connected with low impedance to the collector connection K via the buried region BL and the heavily doped low-impedance trench walls CA. The p-doped base is connected to the base connection B. The emitter connection E is arranged correspondingly over the heavily doped n++-type region. The base, emitter and collector regions of the transistor are mutually insulated by means of insulation regions I1 to I3, which are preferably made of silicon oxide SiO2. A passivation layer P is subsequently applied over the entire arrangement, that is to say the regions TB and SB. The passivation layer may, for example, consist of silicon nitride Si3N4.

Figure 4:
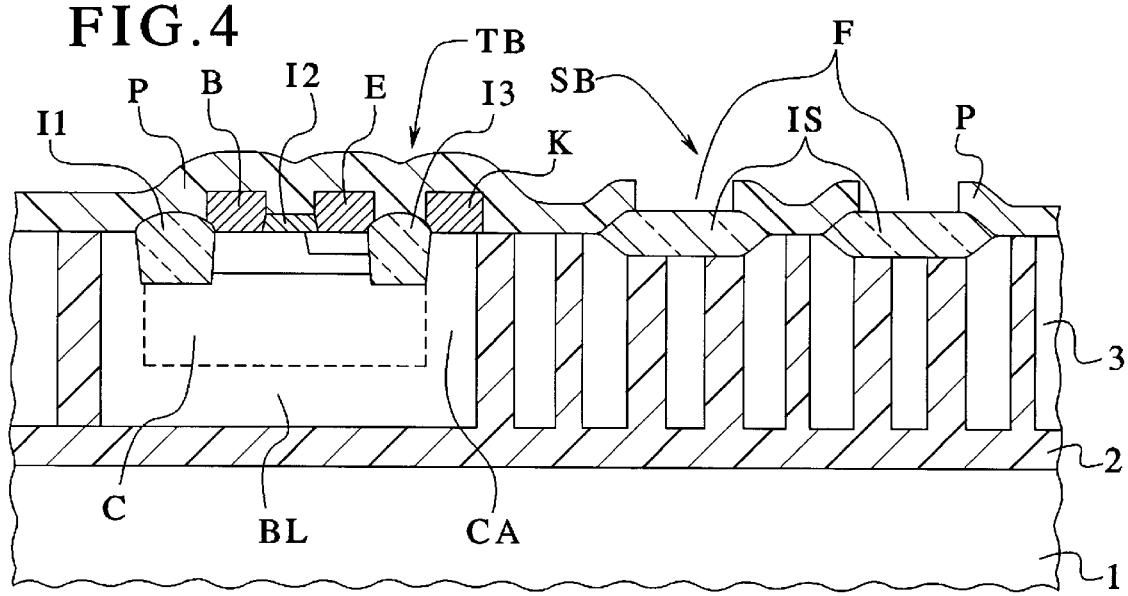

Following on from the production of the transistor arrangement and the passivation layer P, the passivation layer P is removed, with the aid of a resist mask, in those regions over the sensor region SB in which field oxide is formed. Windows F, FIG. 4, are produced which have a diameter of approximately 0.7 to 1.5 μm. After this, the field oxide IS, the doping insulating material 4 in the trenches, situated underneath, of the sensor region and the insulating layer 2 are selectively removed at least in subregions of the sensor region SB. This can be done, for example, using a wet-chemical or a dry etching process without any resist covering, while using the passivation layer P as a mask. The insulating layer 2 is in this case removed completely under the movable electrodes BE1, BE2 of the sensor element and incompletely under the immovable electrodes FE1 to FE3 of the sensor element, with the result that the latter are furthermore connected mechanically to the substrate 1 by means of insulating webs 2a, FIG. 5.

In order to solve an adhesion problem (sticking) which may possibly occur during the removal of the insulating layer 2 under the region of the movable electrodes BEi, sublimating chemicals, for example cyclohexane or dichlorobenzene, can be used.

A covering layer is deposited next, for example made of nitride or plasma nitride, metal (aluminum or the like), PSG, BPSG or polysilicon, for example with conformal reproduction, poor edge covering being desired, in order to close the windows F. Slight depositions on the electrodes BE1, BE2, FE1 to FE3 and on the substrate surface are permissible and desirable, because this serves as an anti-sticking measure (anti-cold-welding measure).

Figure 5:
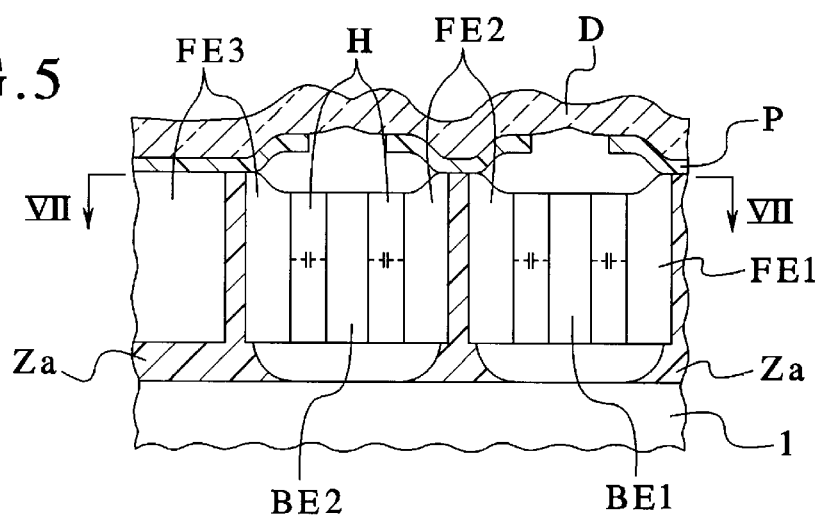

FIG. 5 shows a cross section of an arrangement following the removal of the insulating material 4 and of the insulating layer 2 next to and under the movable electrodes BE1, BE2 of the sensor region SB, whereas the insulating layer 2a is still partially present under the fixed electrodes FE1, FE2 and FE3. There is a planar covering D made of (plasma) nitride, metal, PSG, BPSG or polysilicon over the arrangement according to FIG. 5, which covering can completely protect the micromechanical device and the integrated transistor arrangement against external influences. In order to improve the mechanical strength, the covering D can have a multilayer structure, for example by successively applying layers. The layers may consist of the materials which are used in any case in the production of the circuit, that is to say, for example, metallization layers (aluminum) or inter-metal dielectrics. The dimensioning is such that the covering D withstands the molding pressures, for example 80 bar, occurring during the encapsulation of the component. A closed cavity in which the movable elements of the sensor are arranged is produced.

Figure 6:
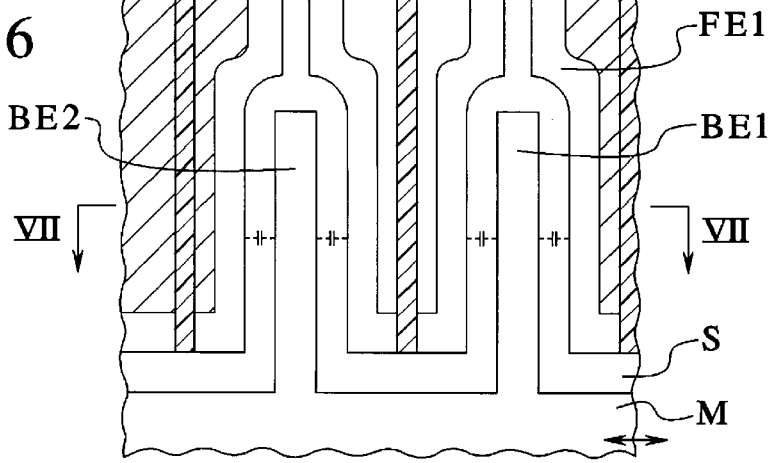
FIG. 6 shows a cross section through a subregion of a capacitive device.

The cross section B—B shown in FIG. 5 illustrates a sensor structure shown in FIG. 6 in cross section A—A. A larger detail from the sensor region is sketched diagrammatically in FIG. 7. The sensor is an acceleration sensor having a movable mass element M which is suspended from the silicon layer 3 via spring elements F1, F2 and further spring elements (not illustrated). The mass element M has finger-shaped movable electrodes BE1, BE2 and BE10, BE11 and BE1i, which project freely into regions between fixed electrodes FE1 to FE3 and FE10 to FE13 and FE1i. Capacitances are formed between the movable electrodes BEi or BEij and the fixed electrodes FEi or FEij, since the trench walls of the electrodes are heavily doped, which capacitances are illustrated purely symbolically in FIGS. 5 to 7. The letters i and j of the reference elements symbolize running variables. In order to be able reliably to remove the insulating layer under the mass element during the production of the sensor part, the mass element M contains holes L. The hole openings are about 0.7 to 1.5 $\mu$m (circular or elliptic) and the distance between the hole centers is about 5 to 8 $\mu$m. However, the holes are not absolutely necessary in principle. That region of the special mask which is used for the production of the sensor structures is sketched in FIG. 7. The removal of the doping insulating material from the trenches and of the insulating layer next to and underneath the movable electrodes, the mass element and the springs takes place completely within the region defined by the special mask SM.

Figure 7A:
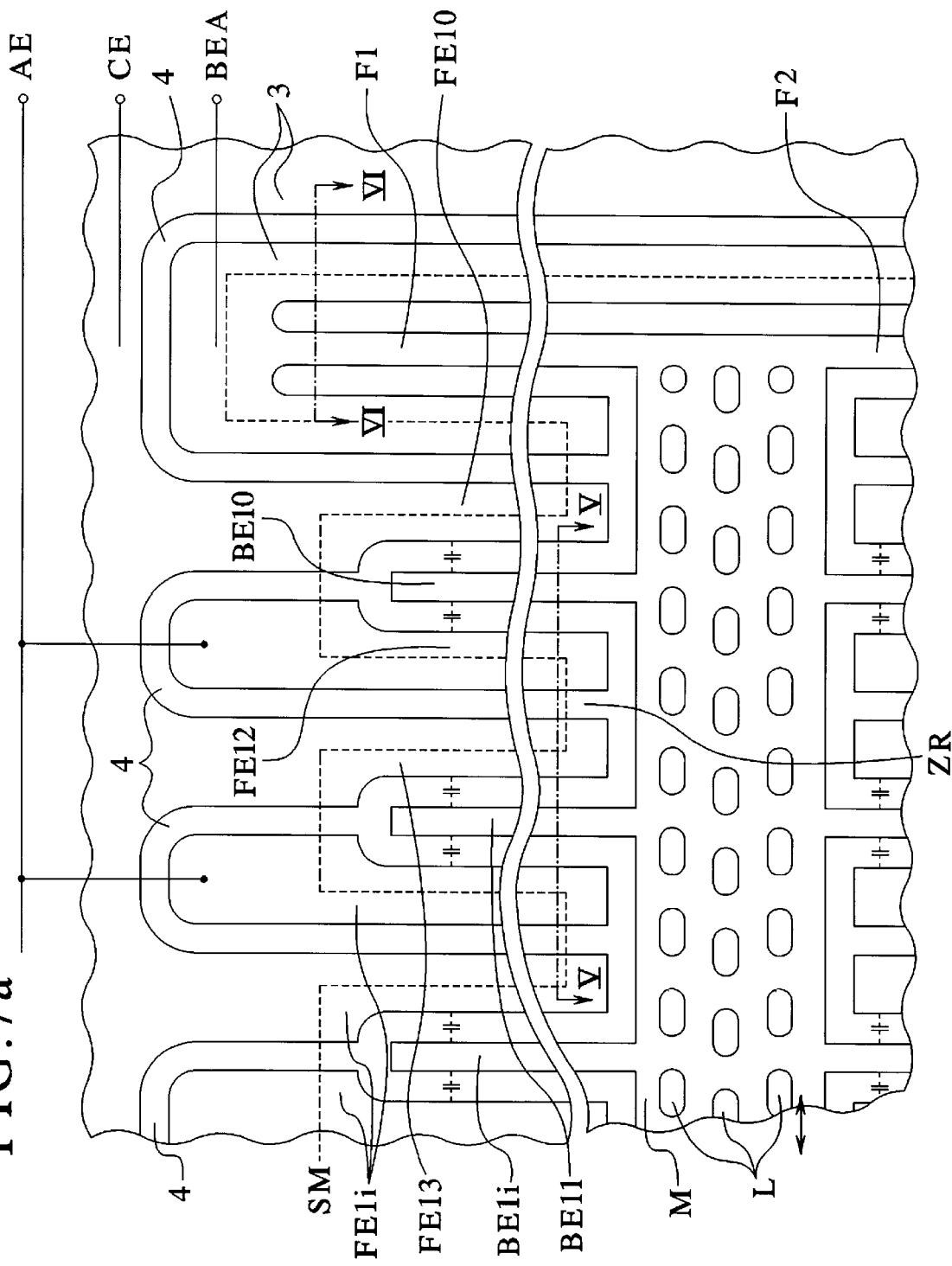
FIG. 7a and 7b shows a larger detail of a section through a capacitive device according to FIG. 6.
Figure 7B:
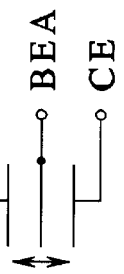

FIG. 7b) shows the equivalent circuit diagram obtained with the sensor structure of FIG. 5 and FIG. 6. The movable electrodes BEi, that is to say BE10 to BE1i, can be connected to a connection BEA via the mass element M and the spring Fi. The fixed electrodes are connected in pairs to connections AE and CE, which correspond to the fixed plates of a capacitor. The movable electrodes form a movable plate of the capacitor, with the result that FIG. 7b) represents a differential capacitor.

The insulating material is completely removed in the gaps S between the movable and fixed electrodes, FIG. 6. The doping insulating material can be removed from the interspaces ZR between two fixed electrodes, FIG. 7. However, it is also possible for the interspaces ZR between the fixed electrodes and the insulating layer which is situated underneath and faces the respective fixed electrodes to be retained. This presupposes a different mask, which can be used to remove only the insulating layer and the doping insulating material underneath and between the movable electrodes.

As an alternative to the structure of FIG. 6 and FIG. 7, the fixed electrodes may be mechanically connected to the substrate 1 and/or the insulating layer 2 in a manner similar to that in the previously cited publication Electronic Design. Fastening via an armature consequently produces self-supporting electrodes, which means that the fixed electrodes have to be sufficiently resistant to bending with regard to acceleration forces acting on them, in order that additional measuring errors do not have an adverse effect on the measuring accuracy.

The sensor arrangement illustrated in FIGS. 6 and 7 reacts sensitively to movements of the mass element M in the arrow direction indicated. The permissible displacement of the finger-shaped, capacitive movable electrodes is less than the gap distance from a fixed electrode, that is to say less than about 0.5 to 1.5 $\mu$m. The evaluation circuit of the sensor device is preferably configured, therefore, as a control loop such that a control voltage counteracts a displacement of the mass element in the sense that the partial capacitances formed by the differential capacitor are each identical. This method has the advantage that it is a zero method and, therefore, is generally more accurate than an absolute method for the determination of the capacitance changes.

A two-dimensional acceleration measurement is possible if use is made of two sensor arrangements according to FIG. 6 and FIG. 7 which are offset by 90° with respect to one another. The oscillation direction of the respective mass elements in this case lies in the oscillation direction of the chip plane in two mutually perpendicular directions. The technique described can be applied in a similar manner to the production of differential pressure sensors.

When the regions of the device which are to be covered are relatively large, a self-supporting covering D not being possible for them, supports are provided which are completely separated from the movable electrodes. (Reference is made to the second exemplary embodiment for the design.)

In addition to the advantages yielded by the covering D, the invention according to the first exemplary embodiment has the following further advantages:

The sensor mass element, the electrodes and the bending beam, that is to say the suspension springs of the sensor, consist of monosilicon, thereby eliminating for the movable parts the bending and stresses known from polysilicon.

The mass element of the sensor and the spring constant of the bending beam and, in the case of a capacitive sensor, the sensor capacitance can be set independently of one another, so that sensor arrays can readily be realized. The sensor arrangement permits a high component density of the sensor, since the electrodes are perpendicular to the chip surface, allowing a large capacitive area to be achieved. The rigidity of the electrodes perpendicular to the oscillation direction is very high, since the section modulus is proportional to the 3rd power of the electrode thickness. For this reason, if appropriate, no adhesion or sticking problem arises, with the result that counteractive chemicals are not necessary.

Since the movable parts of the sensor are located in the silicon or in the silicon layer and not on the chip surface, the sensor is extremely robust in mechanical terms. Arranging the electrodes and the mass element in the chip plane also automatically provides overload protection in the chip plane.

The number of masks is not increased when using a bipolar or a BICMOS standard process as the basic technology for the evaluation circuit of the intelligent sensor. As a result, considerable costs can be saved and the production process can be simplified overall.

In principle, the method according to the invention and/or the sensor device according to the invention can be combined with all known technologies. In particular, the sensor device is VLSI-compatible, thereby enabling structure widths of less than 1 $\mu$m to be achieved. The trench etching and filling methods known from semiconductor technology as well as customary semiconductor methods can therefore be used in the production.

Figure 8:
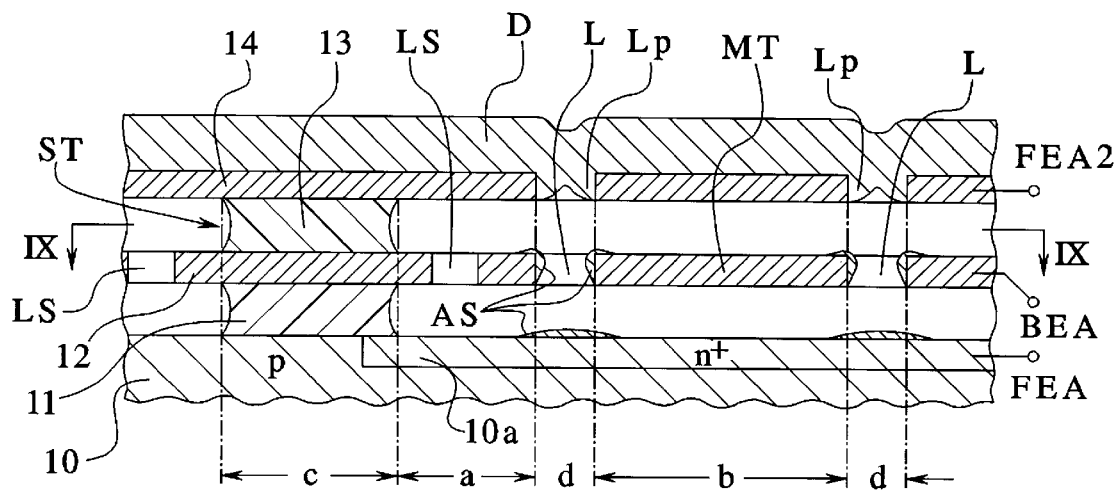
FIG. 8 shows a partial cross section through a second device according to the invention.
Figure 9:
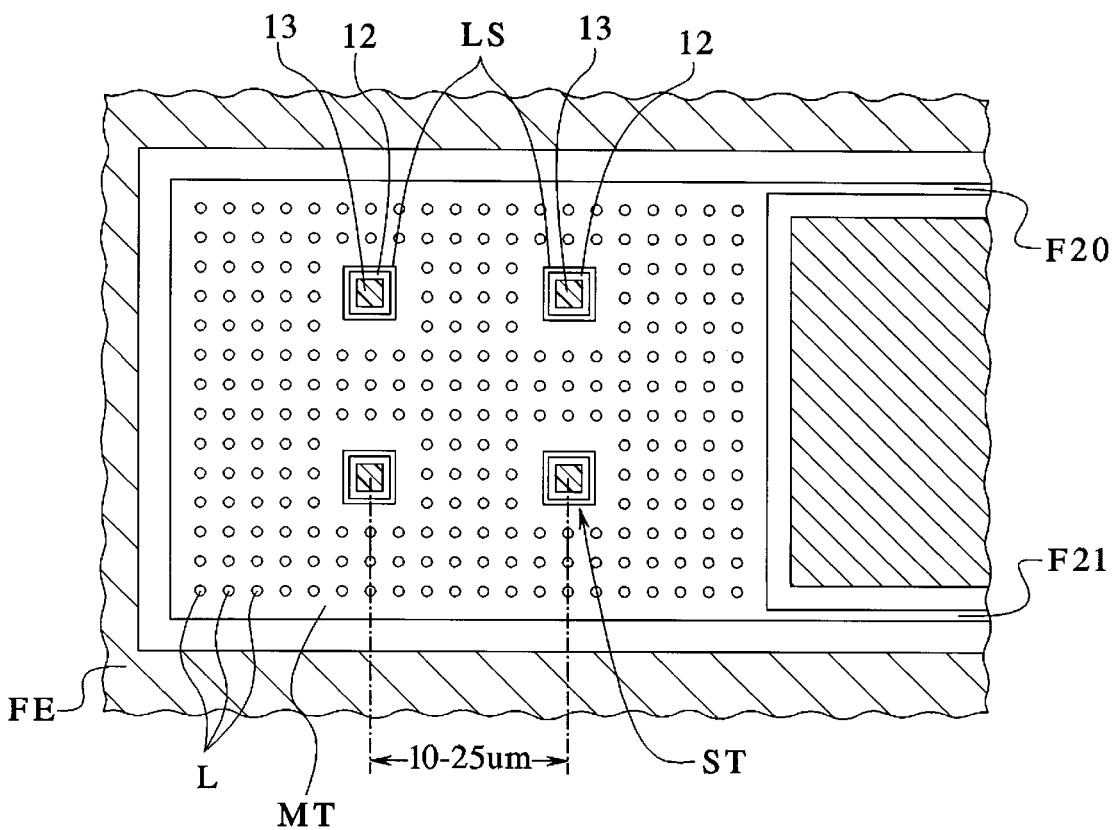
FIG. 9 shows a larger detail of a different cross section through the device of FIG. 8.

FIGS. 8 and 9 show a further exemplary embodiment of the invention. This is an acceleration sensor having a mass element MT which is suspended in a semiconductor body by means of spring elements F 20 and F 21. The mass element MT can be interpreted as the movable electrode of a differential capacitor, in a manner similar to the arrangement shown in FIG. 7. According to FIG. 8, the mass element is connected to a connection BEA, while the two fixed electrodes 10 and 14 are connected to corresponding connections FEA 1 and FEA 2, respectively. The fixed electrode 10 comprises a semiconductor substrate in which an n+conducting trough 10$a$ is embedded.

Given the comparatively large dimensions of the sensor, supports ST are provided for the cover D in the region of the mass element MT. FIGS. 8 and 9 show corresponding sections or partial sections through the marked plane. The supports ST are completely separated from the movable mass element MT by an air gap LS. Provided in the mass element are holes L, which serve for exposing the sensor part by etching during the production process.

The structure according to FIG. 8 is produced as follows: a first insulating layer is first of all produced, for example by (local) oxidation, over the hole area of a substrate 10 having the heavily doped region 10$a$. After this, a polysilicon layer is applied, from which the regions 12 and the mass element MT are produced by structuring. The holes L and the annular openings LS are etched during the structuring. An auxiliary oxide or a phosphorus glass (PSG, BPSG) is subsequently applied over the whole areas as an insulating layer region. A polysilicon layer, nitride, metal or silicate glass layer (PSG, BPSG) is subsequently deposited, in turn, over the whole area and is structured as the layer 14 in such a way that similar holes Lp are preferably produced over the holes L of the mass element. The holes L, LS and Lp in the layers 12, MT and 14 must be constructed as through-holes. Subsequently, by selective etching, the structured insulating layer region 13 is formed through the holes in the layer 14 and the first insulating layer is removed through the holes L and LS in the regions 12 (partially) and MT (completely). The region 11 under the region 12 remains. The mass element MT is consequently exposed, with the result that it is now suspended only from the spring elements F 20 and F 21. A support remains over the substrate 10 in the support regions ST and, according to FIG. 8, it consists of the layer sequence 11, 12 and 13. This support is a continuous mechanical connection between the substrate 10 and the polysilicon layer 14. A similar support structure is possible in the first exemplary embodiment.

A covering layer as a covering D, for example an insulating layer, is subsequently applied over the polysilicon layer 14. This covering layer may consist of nitride, that is to say plasma nitride or passivation nitride, phosphorus glass (PSG or BPSG) or may be a TEOS layer. Furthermore, a metal or polysilicon layer may be provided. The layer is deposited, for example, by means of conformal reproduction. It is critical that the holes in the layer 14 be closed off by this layer. Possible depositions AS, which are produced on the substrate 10 or on the movable electrode MT during this process step, are not disadvantageous, rather they are desirable, since as a result the electrodes of the sensor can rest at the very most at certain points and a sticking problem is thus largely avoided without any further chemical process steps.

The covering D produced in this way can be further reinforced by applying or depositing additional layers, for example multilayer metallization. A passivation layer is usually applied as the upper covering layer. The thickness of the cover layer deposited over the polysilicon layer 14 may about 1 to 4 $\mu$m. The dimensioning is such that the covering D withstands the maximum molding pressures.

The dimensions shown in FIG. 8 emerge from the lateral etching widths when selectively etching the mass element MT to exposure, taking account of the fact that supports ST must remain. Therefore, given a hole opening D of the hole L of about 0.7 to 1.5 $\mu$m and a lateral etching width a, corresponding to approximately b/2, of 3 to 4 $\mu$m, a distance of 5 to 8 $\mu$m between the hole centers is provided. The width c of the support base should be about 3 to 4 $\mu$m and the distance between supports should be about 10 to 25 $\mu$m. During the production of the cover D, the material can be compressed in a conventional manner by means of a temperature treatment.

The invention has the advantage that mechanical overload protection is present in all three dimensions. The invention is suitable in principle for being buried in a substrate by means of CVD oxide, plasma nitride, selective epitaxy or other methods for other materials, for example metals.

Inexpensive mounting in plastic and a standard treatment of separated chips are thus possible during the production of the housing. A considerable reduction in the cost of the integrated sensor is produced particularly when there is a high integration level, that is to say in the case of a sensor having evaluation electronics and output power transistors. This is of prime importance for applications involving mass production, for example for delay measurement in airbag systems or in other sensor systems.

The invention is furthermore suitable both for known sensor arrangements using polysilicon as sensor elements and for monosilicon sensor elements. The invention is fully VLSI-compatible using known and available etching and filling methods. In principle, it can be combined with all known semiconductor technologies. Integrated sensor production without significantly increasing the number of masks required is possible, in particular, with the technology illustrated in the first exemplary embodiment. This yields further considerable cost advantages. Details concerning doping and dimensions given in the description are only exemplary details. Different dimensions or dopings may be expedient in the case of other sensors, for example a doping of the trench walls in the sensor region may, if appropriate, be dispensed with, the transistor structure being produced using technology which is known per se.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A micromechanical device in a micromechanical region, comprising:

a carrier;

an insulating layer arranged over the carrier;

a one-piece silicon layer having a first subregion directly on the insulating layer, and a second subregion, which has no insulating layer situated thereunder;

a movable structure which is formed by the second subregion and which is connected to the carrier via a through part of the silicon layer;

a further layer over the silicon layer which, at least in a region of the second subregion, is not in contact with the silicon layer and which has windows in the region of the second subregion; and a covering layer as a planar covering over the further layer, by which a closed cavity is produced.

2. The device as claimed in claim 1, wherein the region contains a monocrystalline semiconductor layer.

3. The device as claimed in claim 1, wherein the further layer is a nitride layer, silicon nitride layer, phosphorus glass layer, metal layer or oxide layer.

4. The device as claimed in one of claims 1, wherein the further layer is a passivation layer.

5. The device as claimed in claim 1, wherein supports for the covering are arranged in the micromechanical region, which supports are separated from a surrounding movable structure in the micromechanical region.

6. The device as claimed in claim 1, wherein the movable structure forms an electrode which is oriented such that the movable structure is movable in a direction perpendicular to a surface of the carrier.

7. The device as claimed in claim 1, wherein the movable structure forms an electrode which is oriented such that the movable structure is movable in a direction parallel to a surface of the carrier.

* * * * *